(12) United States Patent
Lai

(10) Patent No.: US 6,790,720 B1
(45) Date of Patent: Sep. 14, 2004

(54) METHOD FOR FABRICATING A MOSFET AND REDUCING LINE WIDTH OF GATE STRUCTURE

(75) Inventor: Erh-Kun Lai, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/605,360

(22) Filed: Sep. 25, 2003

(51) Int. Cl.[7] ............... H01L 21/336; H01L 21/3205
(52) U.S. Cl. ............ 438/197; 438/585; 438/586; 438/592; 438/595; 438/591; 438/666; 438/684; 438/700; 438/287
(58) Field of Search ............... 438/197, 287, 438/585, 586, 592, 595, 591, 666, 684, 700

(56) References Cited

U.S. PATENT DOCUMENTS

| | | | | |
|---|---|---|---|---|
| 4,869,781 A | * | 9/1989 | Euen et al. ............... 438/287 |
| 5,476,802 A | * | 12/1995 | Yamazaki et al. ........... 438/307 |
| 5,776,821 A | * | 7/1998 | Haskell et al. ............. 438/585 |
| 6,184,116 B1 | * | 2/2001 | Shen et al. ............... 438/587 |
| 6,200,887 B1 | * | 3/2001 | Balasubramaniam et al. .... 438/585 |
| 6,221,704 B1 | * | 4/2001 | Furukawa et al. ........... 438/197 |
| 6,686,300 B2 | * | 2/2004 | Mehrotra et al. ........... 438/142 |
| 2004/0099891 A1 | * | 5/2004 | Mehrotra et al. ........... 257/288 |

* cited by examiner

*Primary Examiner*—Matthew Smith
*Assistant Examiner*—B. V. Keshavan
(74) *Attorney, Agent, or Firm*—Jianq Chyun IP Office

(57) ABSTRACT

A method for fabricating a MOSFET is provided. The method comprises: providing a substrate, the substrate having a gate structure; forming a drain region and a source region in the substrate, the drain region and the source region being on two sides of the gate structure respectively; forming a metal suicide layer on the surface of the gate structure, the drain region, and the source region; forming a patterned block on the metal silicide layer above the gate structure, and forming a first dielectric layer above the substrate except the gate strcutre, the patterned block being formed above the center of the gate structure and the metal silicide layer above the gate structure beside two sides of the patterned block being exposed; removing a portion of the metal silicide layer and a portion of the gate structure by using the patterned block as a mask; and forming a drain extension region and a source extension region in the substrate, beside two sides of the remaining gate structure.

11 Claims, 5 Drawing Sheets

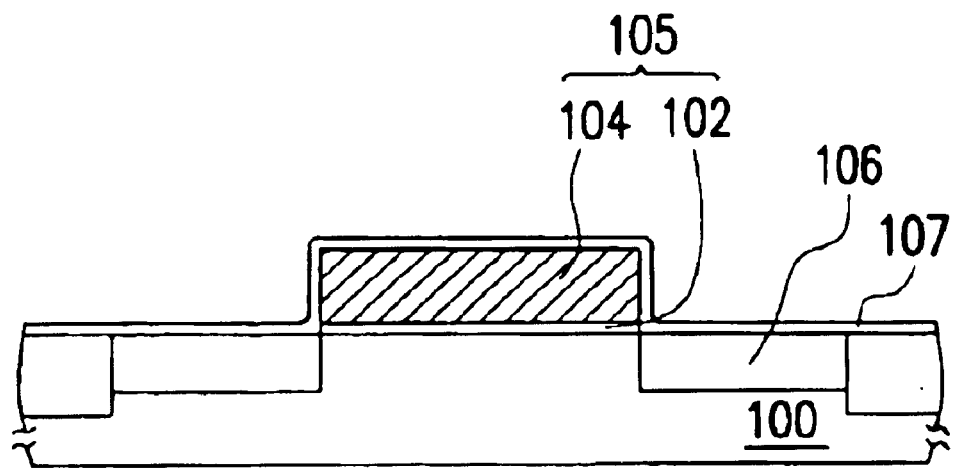
FIG. 1B'
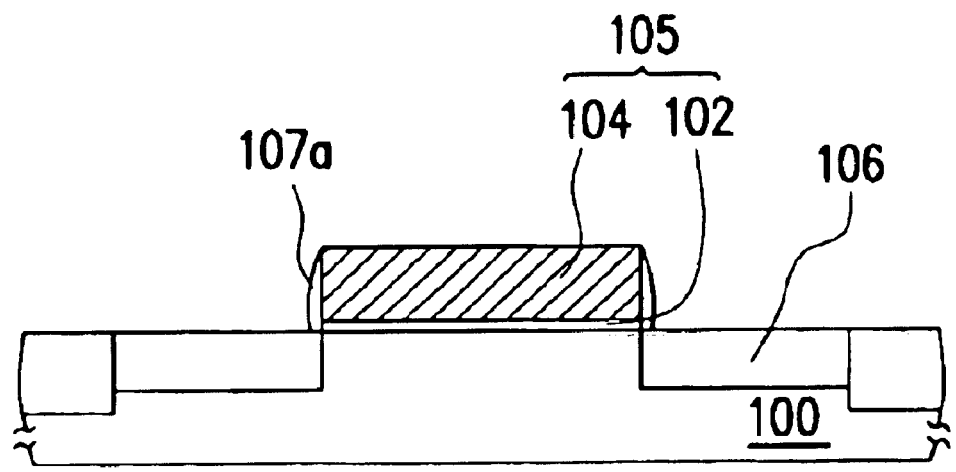
FIG. 1B"

METHOD FOR FABRICATING A MOSFET AND REDUCING LINE WIDTH OF GATE STRUCTURE

BACKGROUND OF INVENTION

1. Field of the Invention

This invention generally relates to a method for fabricating a semiconductor device, and more particularly to a method for fabricating a metal oxide semiconductor field effect transistor (MOSFET) and reducing the line width of the gate structure.

2. Description of Related Art

As the integration level of integrated circuits increases, the semiconductor devices are getting smaller and smaller. MOSFETs become the widely used devices in the integrated circuits because of their low power consumption and suitability for high-density integrated circuits. To overcome the problems of a higher contact resistance, a longer RC delay, and a lower operational speed due to the diminution of the line width of the gate, conventionally, a metal silicide is formed on the gate to reduce the resistance between the gate and the metal line.

However, as the line width of the gate continues to shrink, it is more difficult to form the desired line width because the photolithography process is much more difficult to control, which will affect the design rule margin.

Further, when the line width of the gate shrinks to below a particular size, a line width effect occurs so that the metal silicide layer can not be well formed on the gate structure with a smaller line width.

In addition, the profile of the extension of the drain and the source also becomes smaller and smaller as the device continues to shrink. Hence, the extension of the drain and the source has to sustain the thermal budget of the anneal process for the metal silicide layer, which makes the profile of the extension of the drain and the source difficult to control.

SUMMARY OF INVENTION

An object of the present invention is to provide a method for fabricating a MOSFET and reducing the line width of the gate, wherein a larger design rule margin is provided for photolithography processes for defining the line width of the gate structure.

Another object of the present invention is to provide a method for fabricating a MOSFET and reducing the line width of the gate, wherein the line width effect of the metal silicide layer is avoided and a metal silicide layer of good quality is formed on the gate structure.

Still another object of the present invention is to provide a method for fabricating a MOSFET to reduce the annealing temperature at the extension of the drain and the source so that the profile of the extension of the drain and the source can be controlled.

The present invention provides a method for fabricating a MOSFET, comprising: providing a substrate, the substrate having a gate structure; forming a drain region and a source region in the substrate, the drain region and the source region being on two sides of the gate structure respectively; forming a metal silicide layer on the surface of the gate structure, the drain region, and the source region; forming a patterned block on the metal silicide layer above the gate structure, and forming a first dielectric layer above the substrate except the metal silicide layer, the patterned block being formed above the center of the gate structure and the metal silicide layer above the gate structure and not covered by the patterned block being exposed on two sides of the patterned block; removing a portion of the metal suicide layer and a portion of the gate structure by using the patterned block as a mask; and forming a drain extension region and a source extension region in the substrate, the drain extension region and the source extension region being on two sides of the remaining gate structure.

In a preferred embodiment of the present invention, the step of forming the patterned block and the first dielectric layer includes performing high density plasma chemical vapor deposition (HDPCVD).

In a preferred embodiment of the present invention, the metal suicide layer exposed on the one side of the patterned block and on the other side of the patterned block are symmetrical and have a same area.

The present invention provides a method for reducing the line width of a gate, comprising: providing a substrate, the substrate having a gate structure; forming a patterned block on the gate structure with high density plasma chemical vapor deposition, the patterned block being formed on the center of the gate structure, the gate structure not covered by the patterned block being exposed on two sides of the patterned block; and removing a portion of the gate structure by using the patterned block as a mask.

In a preferred embodiment of the present invention, the gate structure exposed on the one side of the patterned block and on the other side of the patterned block are symmetrical and have a same area.

In brief, the present invention reduces the line width of the gate structure by forming a patterned block on the gate structure. Hence, the line width of the gate structure can be defined during the photolithography process to be wider so that the photolithography process has a larger design rule margin.

Further, because the present invention provides a larger line width for the gate structure, the metal silicide layer can be well formed on the gate structure without the line width effect.

In addition, because the extension of the drain and the source is formed after the metal silicide layer is formed, the extension of the drain and the source does not have to sustain the thermal budget of the anneal process for forming the metal silicide layer. Hence, the profile of the extension of the drain and the source is easier to control.

The above is a brief description of some deficiencies in the prior art and advantages of the present invention. Other features, advantages and embodiments of the invention will be apparent to those skilled in the art from the following description, accompanying drawings and appended claims.

DETAILED DESCRIPTION

FIGS. 1A-1G show the cross-sectional view of a preferred embodiment for fabricating a MOSFET in accordance with the present invention.

Figure 1A:
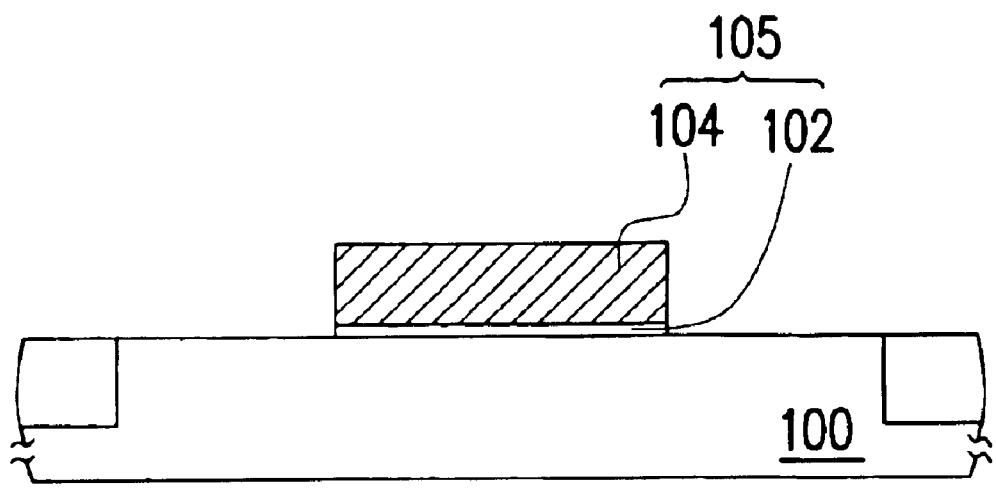
FIGS. 1A-1G show the cross-sectional view of a preferred embodiment for fabricating a MOSFET in accordance with the present invention.

Referring to FIG. 1A, a substrate 100 is provided. The substrate 100 has a gate structure 105 formed thereon. The gate structure 105 includes a gate dielectric layer 102 and a conducting layer 104. The substrate 100 is a silicon substrate; the material of the gate dielectric layer 102 is, for example, silicon oxide; the material of the conducting layer 104 is, for example, polysilicon. The gate structure 105 is formed by forming a dielectric material and a conducting layer (not shown) in sequence on the substrate 100 and patterning the dielectric material and the conducting layer.

Figure 1B:
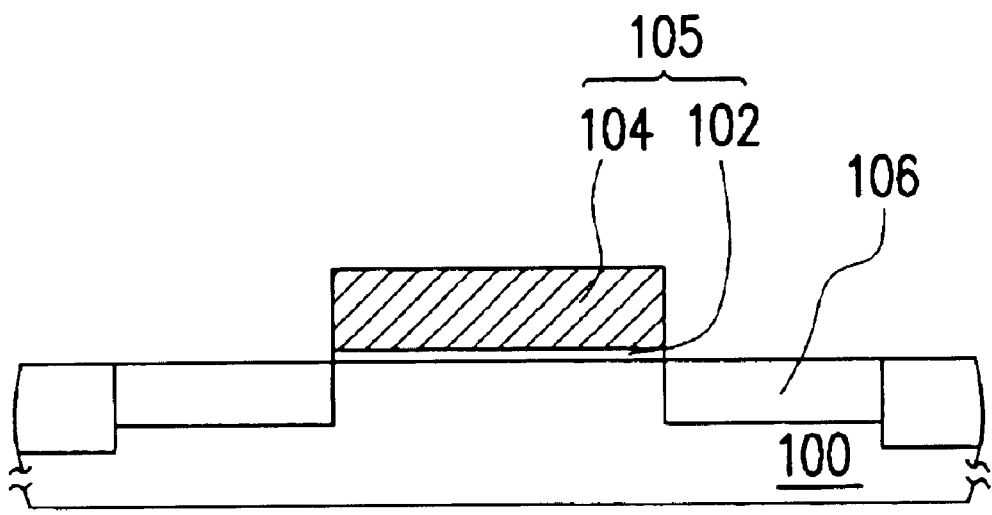

Referring to FIG. 1B, a drain/source region 106 is formed in the substrate 100. The drain/source region 106 is on two sides of the gate structure 105 respectively. The drain/source region 106 is formed by ion implanting the N-type impurities such as P or As or P-type impurities such as B or $BF_2^+$ into the substrate 100, using the gate structure 105 as a mask.

Figure 1C:
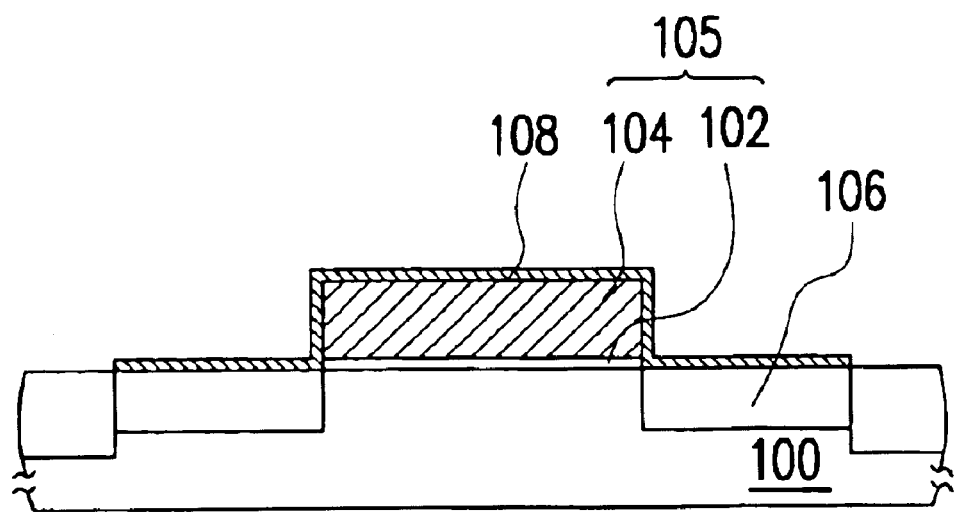

Referring to FIG. 1C, a metal silicide layer 108 is formed on the surface of the gate structure 105 and the drain/source region 106. The metal silicide layer 108 is $CoSi_2$ or $TiSi_2$. The metal silicide layer 108 can be formed by forming a metal material layer (not shown) and performing an anneal process to induce the silicon on the surfaces of the conducting layer 104 and the drain/source region 106 to react with the metal material layer. Then, the unreacted metal material layer is removed.

Figure 1D:
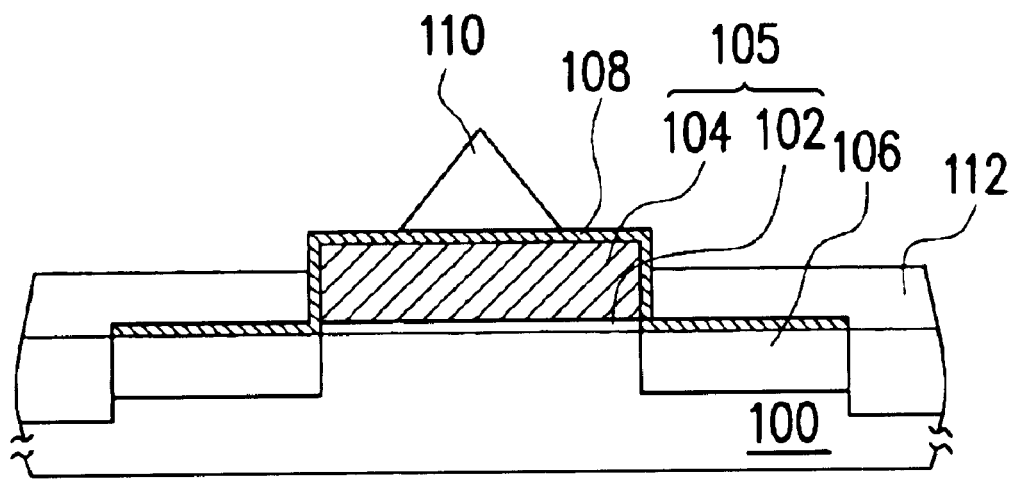

Referring to FIG. 1D, a patterned block 110 is formed on the metal silicide layer 108 above the gate structure 105, and a dielectric layer 112 is formed over the substrate 100 except the gate structure 105. The patterned block 110 is formed at the center of the top part of the gate structure 105. Further, beside both sides of the patterned block 110, portion of the metal suicide layer 108 at the top of the gate structure 105 is exposed. The material of the patterned block 110 and the dielectric layer 112 is, for example, silicon oxide. The patterned block 110 and the dielectric layer 112 are formed by, for example, a high density plasma chemical vapor deposition (HDPCVD) process. In this embodiment, the cross section of the patterned block 110 is triangular.

It should be noted that the patterned block 110 is formed above the center of the gate structure 105 and the metal silicide layer 108 exposed on the one side of the patterned block 110 and on the other side of the patterned block 110 are symmetrical and have a same area. By adjusting and controlling the etching-deposition rate of the high density plasma chemical vapor deposition, the above patterned block 110 can be formed and the width of the patterned block 110 can be controlled.

Figure 1E:
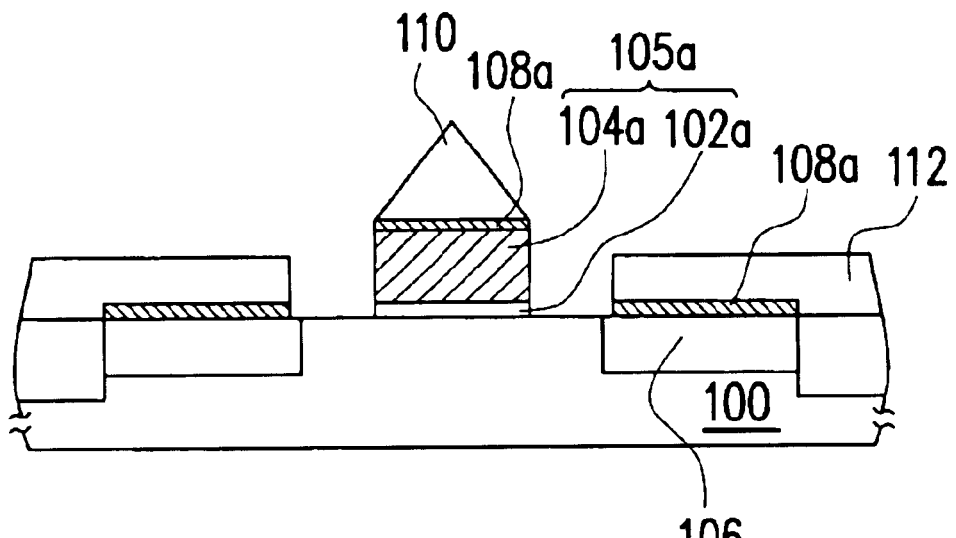

Referring to FIG. 1E, by using the patterned block 110 and the dielectric layer 112 as a mask, a portion of the metal silicide layer 108 and a portion of the gate structure 105 are removed to form the gate structure 105a and the metal silicide layer 108a. The line width of the gate structure 105a is narrower than that of the gate structure 105. Further, the metal silicide layer 108a is only formed above the gate structure 105a and the drain/source region 106.

Figure 1F:
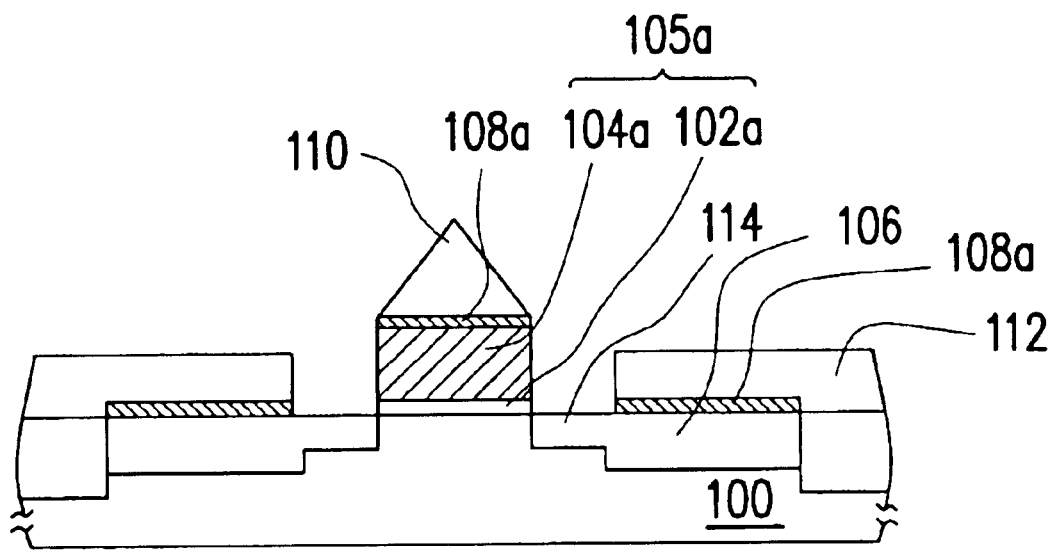

Referring to FIG. 1F, a drain/source extension region 114 is formed in the substrate 100 beside two sides of the gate structure 105a. The drain/source extension region 114 can be formed by, using the patterned block 110 and the dielectric layer 112 as a mask, ion implanting the N-type impurities such as P or As or P-type impurities such as B or $BF_2^+$ into the substrate 100. Because the drain/source extension region 114 is formed after forming the metal silicide layer 108, no anneal process would be applied to the drain/source extension region 114.

Figure 1G:
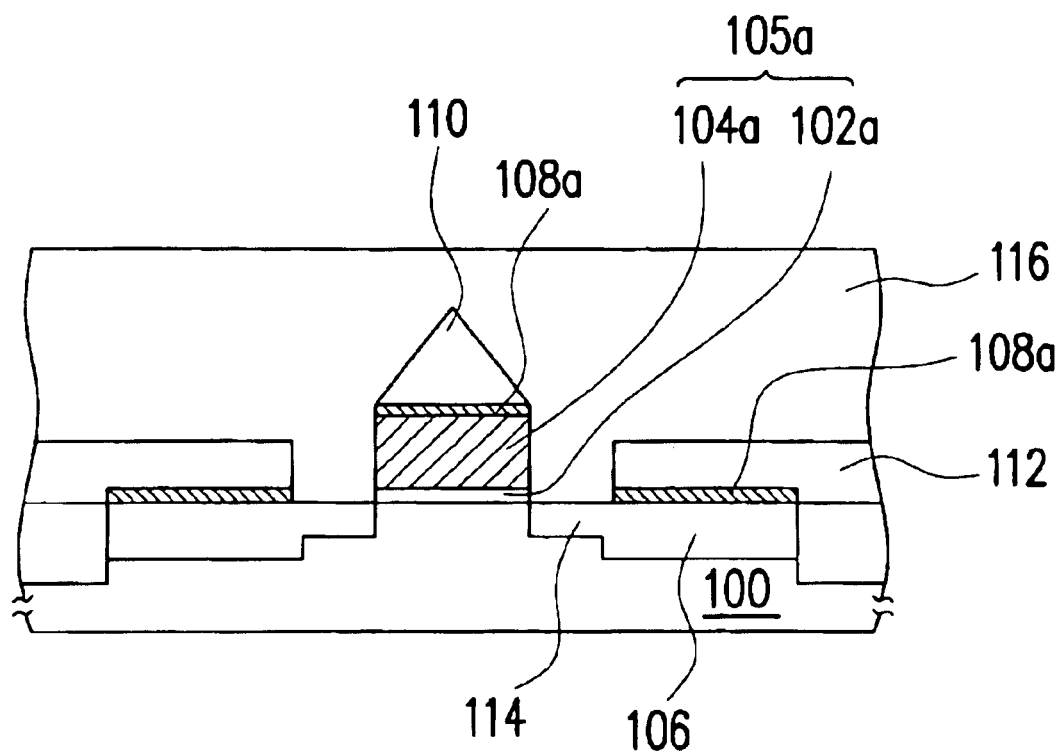

Referring to FIG. 1G, a dielectric layer 116 is formed on the substrate 100. The dielectric layer 116 is used as an inter-layer dielectric (ILD) for the MOSFET device. The material of the dielectric layer 116 is silicon oxide. The dielectric layer 116 is formed by HDPCVD.

In a preferred embodiment of the present invention, the following steps shown in FIG. 1B' and FIG. 1B" can be performed between FIG. 1B and FIG. 1C. First, a lining oxide layer 107 is formed on the surface of the gate structure 105 and the substrate 100, as shown in FIG. 1B'. Then the lining oxide layer 107 is etched back so that only the sidewall of the gate structure 105 has the remaining lining oxide layer 107a thereon, as shown in FIG. 1B". Then, the step shown in FIG. 1C is performed to form the metal silicide layer 108. Therefore, the metal silicide layer 108 would not be formed on the sidewall of the gate structure 105.

Further, in FIG. 1D, the patterned block 110 and the dielectric layer 112 is deposited by adjusting and control the etching-deposition rate of HDPCVD. However, the patterned block 110 and the dielectric layer 112 also can be formed by forming a dielectric material layer (not shown) on the substrate 100 and the gate structure 105 and etching back the dielectric material layer.

It should be noted that the present invention is illustrated by applying it to form a MOSFET. However, the present invention is not limited to form a MOSFET but can be applied to any gate structure for reducing the line width of the gate structure.

In summary, the present invention has at least the following advantages: 1. The present invention reduces the line width of the gate structure by forming a patterned block on the gate structure. Hence, the line width of the gate structure can be defined during the photolithography process to be wider so that the photolithography process has a larger design rule margin. 2. Because the present invention provides a larger line width for the gate structure, the metal silicide layer can be well formed on the gate structure without the line width effect. 3. Because the extension of the drain and the source is formed after the metal silicide layer is formed, the extension of the drain and the source does not have to sustain the thermal budget of the anneal process for forming the metal silicide layer. Hence, the profile of the extension of the drain and the source is easier to control.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method for fabricating a metal oxide semiconductor field effect transistor, comprising:

providing a substrate, said substrate having a gate structure;

forming a drain region and a source region in said substrate, beside two sides of said gate structure, respectively;

forming a metal silicide layer on the surface of said gate structure, said drain region, and said source region;

forming a patterned block on said metal silicide layer above said gate structure, and forming a first dielectric layer above said substrate except said gate structure, wherein said patterned block is formed above a center of said gate structure and said metal silicide layer above said gate structure beside two sides of said patterned block is exposed;

removing a portion of said metal silicide layer and a portion of said gate structure by using said patterned block as a mask; and forming a drain extension region and a source extension region in said substrate, said drain extension region and said source extension region being on two sides of said remaining gate structure.

2. The method of claim 1, wherein said step of forming said patterned block and said first dielectric layer includes performing a high density plasma chemical vapor deposition.

3. The method of claim 1, wherein said patterned block and said first dielectric layer are silicon oxide.

4. The method of claim 1, wherein said metal silicide layer exposed on the one side of said patterned block and on the other side of said patterned block are symmetrical and have a same area.

5. The method of claim 1, wherein said step of forming said patterned block and said first dielectric layer further comprises forming a dielectric material layer; and etching back said dielectric material layer.

6. The method of claim 1, wherein after said step of forming said drain extension region and said source extension region, the method further comprises forming a second dielectric layer on said substrate.

7. The method of claim 1, wherein after said step of forming said drain region and said source region and before said step of forming said metal silicide layer, the method further comprises forming a lining layer on said substrate to cover said gate structure, said drain region, and said source region; and etching back said lining layer to have said lining layer being remained on a sidewall of said gate structure.

8. A method for reducing a line width of a gate, comprising:

providing a substrate, said substrate having a gate structure;

forming a patterned block on said gate structure with a high density plasma chemical vapor deposition, said patterned block being formed on the center of said gate structure, wherein said gate structure beside two sides of said patterned block is exposed; and removing a portion of said gate structure by using said patterned block as a mask.

9. The method of claim 8, wherein said patterned block is silicon oxide.

10. The method of claim 8, wherein said gate structure exposed on the one side of said patterned block and on the other side of said patterned block are symmetrical and have a same area.

11. The method of claim 8, said step of forming said patterned block further comprises;

forming a dielectric material layer with a high density plasma chemical vapor deposition; and etching back said dielectric material layer to form said patterned block.

* * * * *